United States Patent
Ionescu et al.

(10) Patent No.: US 11,545,887 B2
(45) Date of Patent: Jan. 3, 2023

(54) SAFETY CUTOFF CIRCUIT FOR POWER CONVERTER

(71) Applicant: Infineon Technologies AG, Neubiberg (DE)

(72) Inventors: Vlad Alexandru Mircea Ionescu, Bucharest (RO); Cristian Garbossa, Bressanone (IT); Andrea Zuccollo, Villa del Conte (IT)

(73) Assignee: Infineon Technologies AG, Neubiberg (DE)

( * ) Notice: Subject to any disclaimer, the term of this patent is extended or adjusted under 35 U.S.C. 154(b) by 25 days.

(21) Appl. No.: 17/232,619

(22) Filed: Apr. 16, 2021

(65) Prior Publication Data

US 2022/0337149 A1    Oct. 20, 2022

(51) Int. Cl.

| | |
|---|---|
| *H02M 1/32* | (2007.01) |
| *H02M 3/158* | (2006.01) |
| *H02M 3/07* | (2006.01) |
| *H02H 7/12* | (2006.01) |
| *H02M 1/00* | (2006.01) |
| *G01R 19/165* | (2006.01) |

(52) U.S. Cl.
CPC ............ *H02M 1/32* (2013.01); *H02H 7/1213* (2013.01); *H02M 1/0006* (2021.05); *H02M 3/07* (2013.01); *H02M 3/158* (2013.01); *G01R 19/16538* (2013.01)

(58) Field of Classification Search
CPC ........ H02M 3/156; H02M 3/158; H02M 1/32; H02M 1/0006; H02M 1/0032; H02H 7/1213; H02H 3/202; H02H 3/243; H02H 7/10; H02H 3/20; H02H 3/24

See application file for complete search history.

(56) References Cited

U.S. PATENT DOCUMENTS

| | | | |
|---|---|---|---|
| 6,275,958 B1 * | 8/2001 | Carpenter | H02M 3/158 714/48 |
| 9,106,075 B2 * | 8/2015 | Tomas | H02H 7/1225 |
| 9,473,028 B1 * | 10/2016 | Hoyt | H02M 1/32 |
| 10,778,099 B1 * | 9/2020 | Womac | H02M 1/32 |
| 2002/0130645 A1 * | 9/2002 | Tsai | H02M 1/32 323/274 |
| 2014/0192441 A1 * | 7/2014 | Briere | H02M 1/32 361/18 |
| 2015/0029618 A1 * | 1/2015 | Collins | H02H 7/1252 323/284 |
| 2015/0162831 A1 * | 6/2015 | Ladret | H02M 3/158 307/23 |
| 2015/0200536 A1 * | 7/2015 | Li | H02H 7/1213 361/18 |
| 2016/0259390 A1 * | 9/2016 | Tomas | H02J 9/061 |
| 2016/0276929 A1 * | 9/2016 | Amei | H02H 7/1213 |
| 2018/0278076 A1 * | 9/2018 | Chen | H02M 3/158 |

(Continued)

*Primary Examiner* — Alex Torres-Rivera
(74) *Attorney, Agent, or Firm* — Shumaker & Sieffert, P.A.

(57) ABSTRACT

This disclosure describes a protection circuit configured to protect a power converter. The protection circuit may be configured to determine when the power converter is operating in a tristate mode, and upon determining that the power converter is operating in the tristate mode, to disable a supply to the power converter based on a comparison of a switch node voltage on a switch node of the power converter to a feedback node voltage on an output node of the power converter.

20 Claims, 6 Drawing Sheets

(56) References Cited

U.S. PATENT DOCUMENTS

2018/0375320 A1* 12/2018 Ho ........................... H02H 3/20
2020/0409442 A1* 12/2020 Uryu .................. H02M 3/1582
2022/0037991 A1*  2/2022 Garbossa ............... H02M 1/32
2022/0216791 A1*  7/2022 Tanaka .................. H02M 1/32

* cited by examiner

SAFETY CUTOFF CIRCUIT FOR POWER CONVERTER

TECHNICAL FIELD

This disclosure relates to DC/DC power converters, and more specifically, to circuits and techniques for disconnecting a DC/DC power converter in order to promote safety and to protect circuit components from short circuit events or other problems.

BACKGROUND

In many systems and devices, DC/DC power converters are used to control voltage and/or current levels within the system or device. In general, DC/DC power converters may convert a source of direct current (DC) from one voltage level to another voltage level. DC/DC power converters may comprise buck converters, boost converters, buck/boost converters, or other types. Some buck converters, for example, may comprise an inductor-capacitor ("LC") circuit that is connected to a switch node, where the switch node is positioned between a high-side power switch and a low-side power switch. A so-called "bootstrap capacitor," which is typically an external component of the DC/DC converter, may be used to provide the charge needed by a driver circuit to control the high side switch. The high-side and low-side power switches are controlled by driver circuits via modulation control signals, such as pulse width modulation (PWM) signals, pulse frequency modulation (PFM) signals, pulse duration modulation signals, pulse density modulation signals, or another type of modulation control signal.

In particular, modulation control signals can be applied to the gates of the high-side and low-side power switches to control the ON/OFF switching of the power switches. The ON/OFF switching of the power switches effectively controls the delivery of power to the switch node that is located between the high-side and low-side switches. In this way, by controlling the high-side and low-side switches of a DC/DC converter, a desired level of current or voltage can be output from the DC/DC converter in order to provide power to a load or another component of the system.

Power converters, such as buck converters, sometimes operate in continuous-conduction mode (CCM), in which case the energy stored in the inductor flows continuously during operation of the buck converter. For example, in CCM, the high-side and low-side switches may operate in a substantially synchronous fashion, such that when the high-side is commanded OFF, the low side is immediately commanded ON, and vice versa.

However, in other situations, power converters may operate differently, e.g., in a non-CCM manner. When operating in a non-CCM manner, the low-side switch may remain OFF regardless of the ON/OFF state of the high-side switch. Furthermore, power converters may also operate in a so-called tristate mode, where both the low-side switch and the high-side switch are turned OFF. More specifically, in the tristate mode, both the high side switch and the low side switch may be turned off simultaneously during one or more switching cycles.

Non-CCM control of the DC/DC power converter may be useful when very small loads are connected to the DC/DC power converter. However, fault monitoring of the DC/DC power converter when the DC/DC power converter is operating in a non-CCM or in tristate presents challenges.

SUMMARY

This disclosure describes circuits and techniques for fault monitoring of a DC/DC power converter. In particular, this disclosure describes circuits and techniques for fault monitoring when the DC/DC power converter is operating in a tristate, where both a low-side switch and a high-side switch are turned OFF for one or more switching cycles. For example, the techniques may include a determination of whether the DC/DC power converter is operating in a tristate mode. If so, one or more voltage or current comparisons can be made to determine whether a protection transistor should disable the DC/DC power converter to protect circuit components. Furthermore, in addition to monitoring tristate, the techniques may also perform addition protection steps that are independent of whether the DC/DC converter is operating in tristate, such as protecting the DC/DC power converter when a voltage drop over the protection transistor is greater than a voltage threshold and/or protecting the DC/DC power converter when current through the protection transistor being greater than a current threshold.

In one example, this disclosure describes a protection circuit configured to protect a power converter. The protection circuit may be configured to determine when the power converter is operating in a tristate mode, and upon determining that the power converter is operating in the tristate mode, disable a supply to the power converter based on a comparison of a switch node voltage on a switch node of the power converter to a feedback node voltage on an output node of the power converter.

In another example, this disclosure describes a method that comprises determining when a power converter is operating in a tristate mode, wherein the power converter comprises a high side switch, a low side switch, and a control circuit configured to control ON/OFF switching of the high side switch and the low side switch, wherein the power converter further includes an inductor and an output capacitor, wherein the inductor is connected to a switch node between the high side switch and the low side switch, and wherein the output capacitor is connected to the inductor at an output node of the power converter. Upon determining that the power converter is operating in the tristate mode, the method may also comprise disabling a supply to the power converter based on a comparison of a switch node voltage on the switch node to a feedback node voltage on the output node.

In another example, this disclosure describes a device comprising a power converter and a protection circuit. The power converter may comprise a high side switch, a low side switch, and a controller circuit configured to control ON/OFF switching of the high side switch and the low side switch. The power converter may also include an inductor and an output capacitor, wherein the inductor is connected to a switch node between the high side switch and the low side switch and the output capacitor is connected to the inductor at an output node of the power converter. The protection circuit may be configured to: determine when the power converter is operating in a tristate mode, and upon determining that the power converter is operating in the tristate mode, disable a supply to the power converter based on a comparison of a switch node voltage on the switch node to a feedback node voltage on the output node.

Details of these and other examples are set forth in the accompanying drawings and the description below. Other features, objects, and advantages will be apparent from the description and drawings, and from the claims.

DETAILED DESCRIPTION

This disclosure describes circuits and techniques for fault monitoring of a DC/DC power converter. In particular, this disclosure describes circuits and techniques for fault monitoring when the DC/DC power converter is operating in a non-CCM. For example, the techniques may include a determination of whether the DC/DC power converter is operating in a tristate mode. If so, one or more voltage or current comparisons can be made to determine whether a protection transistor should disable the DC/DC power converter to protect circuit components. Furthermore, in addition to monitoring tristate, the techniques may also perform additional protection steps that are independent of whether the DC/DC converter is operating in CCM or non-CCM, such as protecting the DC/DC power converter when a voltage drop over the protection transistor is greater than a voltage threshold and/or protecting the DC/DC power converter when current through the protection transistor being greater than a current threshold.

Figure 1:
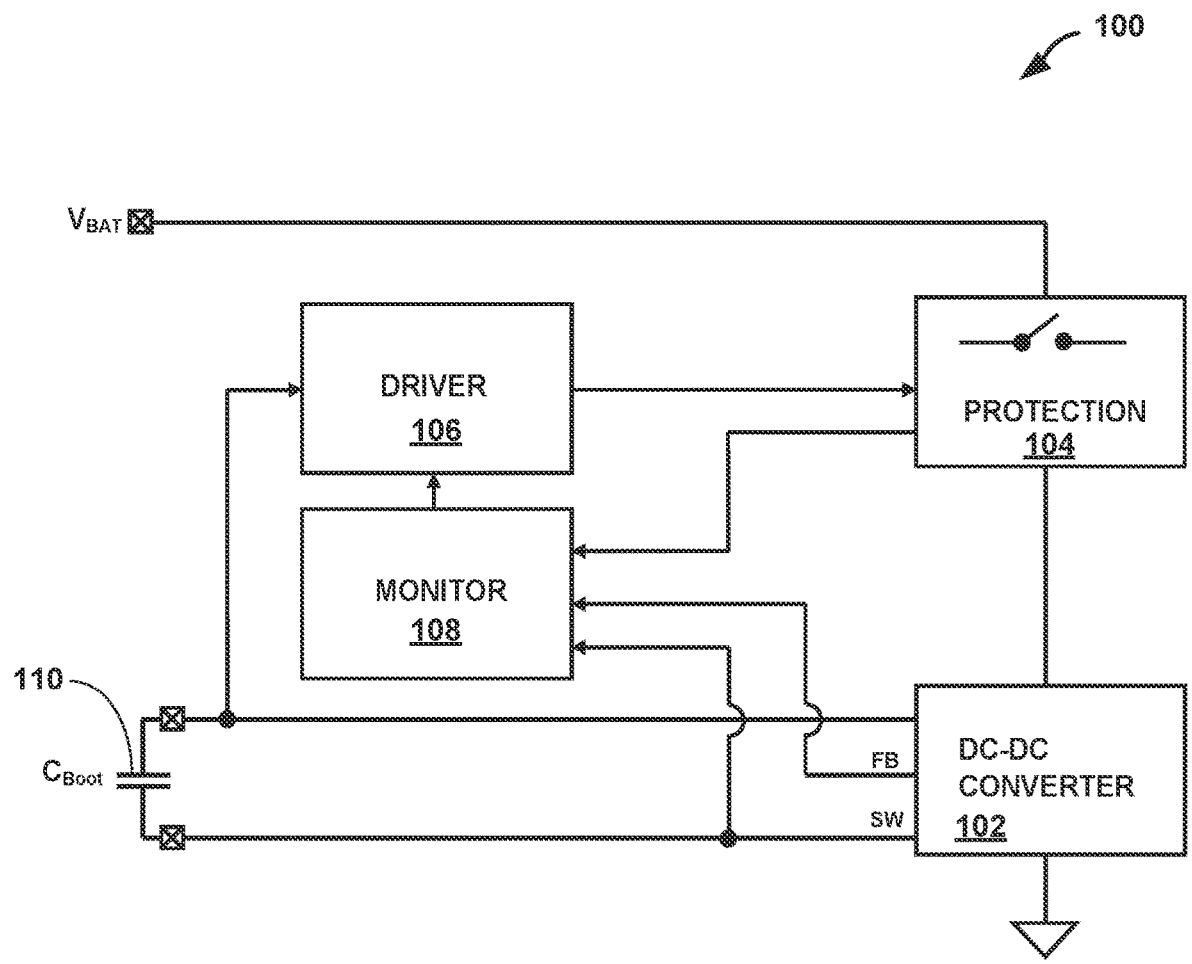
FIG. 1 is a block diagram illustrating an example DC/DC power converter and protection circuit elements consistent with this disclosure.

FIG. 1 is a block diagram illustrating an example device 100 comprising a DC/DC power converter 102 and protection circuit elements (e.g., monitor circuit 108, driver circuit 106 and protection circuit 104) consistent with this disclosure. DC/DC power converter 102 may comprise a high side switch, a low side switch, and a controller circuit configured to control ON/OFF switching of the high side switch and the low side switch. In addition, DC/DC power converter 102 may include an inductor and an output capacitor, wherein the inductor is connected to a switch node between the high side switch and the low side switch and the output capacitor is connected to the inductor at an output node of the power converter. An external capacitor ("Cboot") 110 may be used to deliver charge for controlling the high side switch of DC/DC power converter 102.

As described in greater detail below, in order to protect DC/DC power converter 102 from short circuit events or other circuit problems, a protection circuit (e.g., monitor circuit 108, driver circuit 106 and protection circuit 104) may be configured to determine when DC/DC power converter 102 is operating in a tristate mode, and upon determining that DC/DC power converter 102 is operating in the tristate mode, to disable a supply to DC/DC power converter 102 based on a comparison of a switch node voltage (SW) on a switch node of DC/DC power converter 102 to a feedback node voltage (FB) on an output node of DC/DC power converter 102. More specifically, in the example of FIG. 1, monitor circuit 108 may be configured to determine when DC/DC power converter 102 is operating in a tristate mode, and upon determining that DC/DC power converter 102 is operating in the tristate mode, monitor circuit 108 may be configured to compare a switch node voltage (SW) on a switch node of DC/DC power converter 102 to a feedback node voltage (FB) on an output node of DC/DC power converter 102. Based on this comparison of the switch node voltage (SW) to the feedback node voltage (FB), driver circuit 106 may be configured to disable a supply to DC/DC power converter 102 by controlling protection circuit 104 so as to disconnect the supply voltage (Vbat) to DC/DC power converter 102. More specifically, when monitor circuit 108 determines that DC/DC power converter 102 is operating in tristate, driver circuit 106 may be configured to control protection circuit 104 so as disable the supply (Vbat) to DC/DC power converter 102 in response to the switch node voltage (SW) exceeding the feedback node voltage (FB) by more than a defined threshold.

DC/DC power converter 102 may sometimes operate in continuous-conduction mode (CCM), in which case the energy stored in the inductor flows continuously during operation of the DC/DC power converter. For example, in CCM, the high-side and low-side switches may operate in a substantially synchronous fashion, such that when the high-side is commanded OFF, the low side is immediately commanded ON, and vice versa.

However, in other situations, DC/DC power converter 102 may operate differently, e.g., in a non-CCM manner. In such cases, the half-bridge is sometimes controlled such that the low-side switch remains OFF regardless of the ON/OFF state of the high-side switch. In this non-CCM control, DC/DC power converter 102 can sometimes be left in tristate (referred to herein as a tristate mode), whereby both the high side switch and the low side switch are turned off simultaneously during one or more switching cycles of DC/DC power converter 102. Such non-CCM control of the DC/DC power converter 102 may be useful when very small loads are connected to the DC/DC converter. However, fault monitoring of the DC/DC power converter when the DC/DC power converter is operating in tristate presents challenges, and the techniques of this disclosure may address these challenges.

Protection circuit 104 may comprise a protection transistor (such as an NMOS transistor). Turning off the protection transistor may disable the supply voltage (Vbat). In some example, protection circuit 104 may further comprise a so-called "kill switch." The protection transistor may be configured to turn off when the kill switch turns on. Driver 106 may control the protection transistor. However, this may require a substantial gate to source voltage, e.g., in the case of an NMOS transistor being used for the protection. Therefore, driver circuit 106 may leverage the existing bootstrap capacitor ("CBoot") 110 that is used by DC/DC power converter 102 for controlling the high side switch of DC/DC power converter. In particular, in addition to being connected to DC/DC power converter 102, bootstrap capacitor 110 may also be connected to driver circuit 106 so that driver circuit 106 can use the charge on bootstrap capacitor to control the protection transistor within protection circuit 104. Driver circuit 106 may be configured to include a charge pump, and the charge pump of driver circuit 106 may be configured to provide charge for controlling the protection transistor within protection circuit 104.

Bootstrap capacitor 110 may form part of the charge pump of driver circuit 106. The charge pump of driver circuit 106 may comprise a diode positioned between bootstrap capacitor 110 and a gate of the protection transistor within protection circuit 104. This diode of the charge pump within driver circuit 106 may comprise a passive diode or an active diode (e.g., a controllable transistor with a body diode). Additional details of different examples using an active diode or a passive diode in the charge pump are discussed in greater detail below.

In addition to monitoring tristate, monitor circuit 108 of FIG. 1 may also perform additional monitoring that is independent of whether DC/DC power converter 102 is operating in CCM or non-CCM. In some examples, protection circuit elements (e.g., monitor circuit 108, driver circuit 106 and protection circuit 104) may be further configured to protect DC/DC power converter 102 when a voltage drop over the protection transistor within protection circuit 104 is greater than a voltage threshold. Alternatively or additionally, protection circuit elements (e.g., monitor circuit 108, driver circuit 106 and protection circuit 104) may also be configured to protect DC/DC power converter 102 when current through the protection transistor of protection circuit 104 is greater than a current threshold. According to this disclosure, the monitoring and disabling of the supply to DC/DC power converter 102 may be based on comparisons that occur in less than 100 microseconds, which may be sufficient to protect DC/DC power converter from short circuit events that could otherwise deliver too much charge to the inductor and ultimately to the load.

Figure 2:
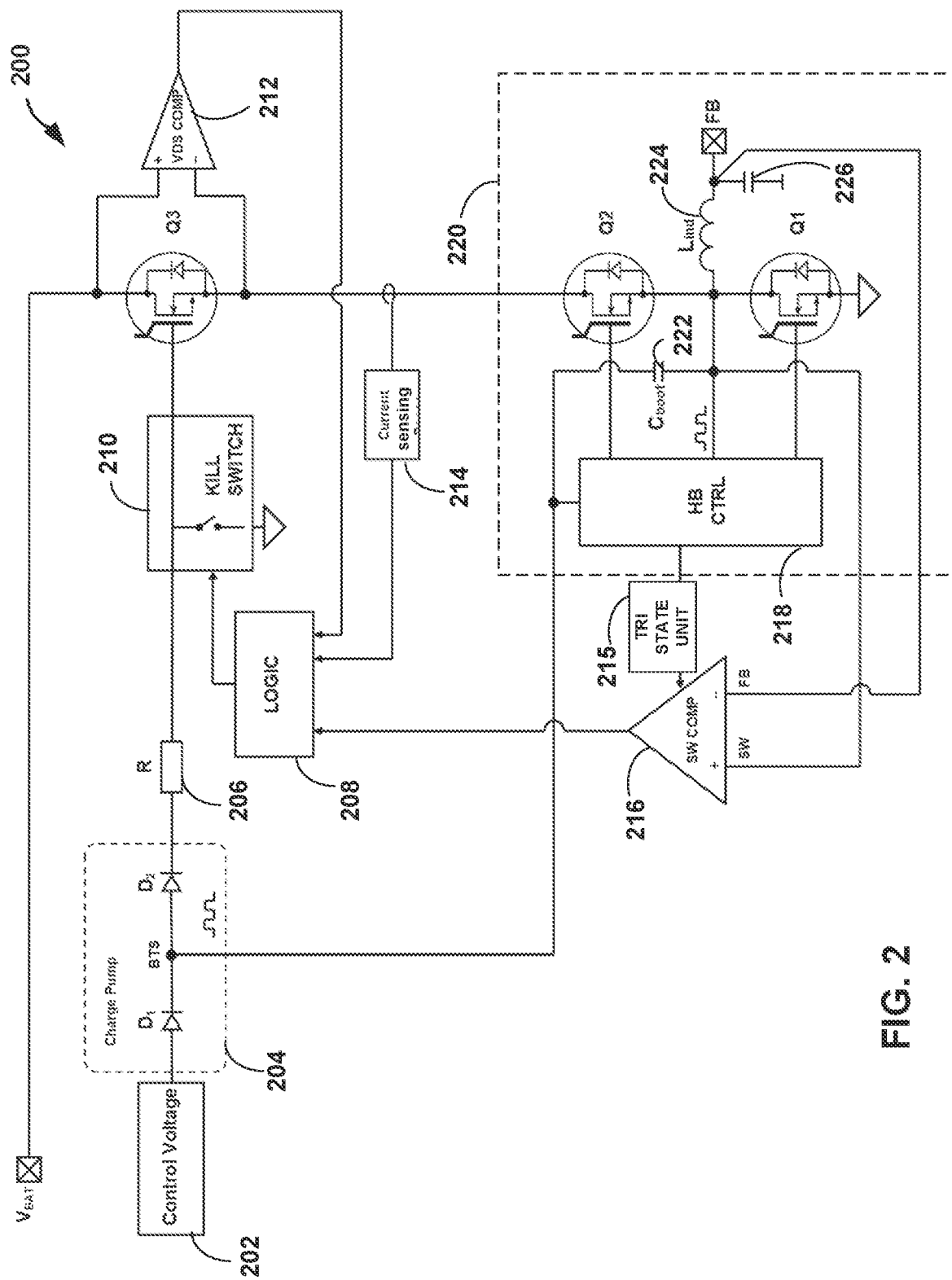
FIG. 2 is a circuit diagram illustrating one example of a DC/DC power converter and protection circuit elements consistent with this disclosure.

FIG. 2 is a circuit diagram illustrating one example of a device 200 comprising a DC/DC power converter 220 and a number of protection circuit elements consistent with this disclosure. DC/DC power converter 220 may comprise a high side switch Q2, a low side switch Q1, and a controller circuit (e.g. half bridge controller "HB CTRL") 218 configured to control ON/OFF switching of high side switch Q2 and low side switch Q1. In addition, DC/DC power converter 220 may include an inductor (Lind) 224 and an output capacitor 226. Inductor 224 may be connected to a switch node located between high side switch Q2 and low side switch Q1, and output capacitor 226 may be connected to inductor 224 at an output node of the power converter. An external capacitor ("Cboot") 222 may be used to deliver charge for controlling the high side switch Q2 of DC/DC power converter 220. The high side and low side switches (Q2 and Q1) may comprise power transistors (such as metal oxide semiconductor field effect transistors (MOSFETS) or insulated gate bipolar transistors (IGBTs)).

In order to protect DC/DC power converter 220 from short circuit events or other circuit problems, protection circuit elements of device 200 may be implemented. In the example of FIG. 2, the protection circuit elements may include tristate unit 215, comparator 216, logic 208, kill switch 210, protection transistor Q3, comparator 212, and current sensing unit 214, although other examples may use more or fewer protection elements. Control voltage unit 202, charge pump 204 and resistor 206 may also be included to facilitate the control of the protection elements.

Tristate unit 215 may comprise separate logic components or elements implemented within half bridge controller 218. Tristate unit 215 may be configured to determine when DC/DC power converter 220 is operating in a tristate mode, and if so, tristate unit may send a control signal to comparator 216. For example, tristate unit 215 may determine tristate by identifying that Q1 and Q2 are both turned OFF over one or more switching cycles. In response to determining that DC/DC power converter 220 is operating in tristate, comparator 216 may compare a switch node voltage on the switch node of DC/DC power converter 220 to a feedback node voltage (FB) on an output node of DC/DC power converter 220. The switch node may correspond to the node between high side switch Q2 and low side switch Q1.

More specifically, comparator 216 may compare the switch node voltage to the feedback node voltage to determine whether the switch node voltage exceeds the feedback node voltage by more than a defined threshold. If so, comparator 216 may send a signal to logic 208 that may ultimately cause kill switch 210 and protection transistor Q3 to disable a supply to DC/DC power converter 220. To disable the supply, logic 208 may send a signal to kill switch 210 to turn on kill switch 210. Turning on kill switch 210, in turn, may cause protection transistor Q3 to turn off, which disconnects the supply voltage (VBat) from DC/DC power converter 220.

As mentioned above, DC/DC power converters (such as DC/DC power converter 220 of FIG. 2) may sometimes operate in CCM, in which case the energy stored in inductor 224 flows continuously during operation of the DC/DC power converter. For example, in CCM, high-side switch Q2 and low-side switch Q1 may operate in a substantially synchronous fashion, such that when high-side switch Q2 is commanded OFF, low side Q1 is immediately commanded ON, and vice versa. There may be a short duration of "dead time" in CCM where both low-side switch Q1 and high-side switch Q2 are OFF for a short period to help ensure that both low-side switch Q1 and high-side switch Q2 are not ON simultaneously, but in general, in CCM, precisely one of switches Q1 or Q2 is on in any given switching cycle.

However, in other situations, DC/DC power converter 220 may operate differently, e.g., in a non-CCM manner. In such cases, the half-bridge is sometimes controlled in a manner whereby low-side switch Q1 remains OFF regardless of the ON/OFF state of the high-side switch Q2. Moreover, when operating in the non-CCM manner, the half-bridge may sometime operate in tristate (e.g., the tristate mode), whereby both high side switch Q2 and low side switch Q1 may be turned off simultaneously during one or more switching cycles of DC/DC power converter 220. As noted above, non-CCM control of the DC/DC power converter 220 may be useful when very small loads are connected to DC/DC power converter 220. However, fault monitoring when DC/DC power converter 220 is in a tristate mode presents challenges, and the techniques of this disclosure may address these challenges.

Protection circuit elements of device 200 may comprise a protection transistor Q3 (which may comprise an NMOS transistor). Turning off protection transistor Q3 may disable the supply voltage (Vbat) to DC/DC power converter 220. Kill switch 210 may facilitate turn off of protection transistor Q3. In particular, protection transistor Q3 may be configured to turn off when kill switch 210 turns on.

Charge pump 204 may provide voltage needed to control protection transistor Q3, which may require a substantial gate to source voltage, e.g., in the case of an NMOS transistor being used for the protection. According to some techniques of this disclosure, charge pump 204 may leverage the existing bootstrap capacitor ("CBoot") 222 that is used by DC/DC power converter 220 for controlling high side switch Q2. In this case, in addition to being connected as part of DC/DC power converter 220, bootstrap capacitor 222 may also be connected to charge pump 204 so that the charge on bootstrap capacitor 222 can be leveraged to control protection transistor Q3.

Charge pump 204 may comprise diodes D1 and D2, with the bootstrap capacitor voltage (BTS) provided to the node between D1 and D2. D1 may comprise an existing diode that is useful for charging of bootstrap capacitor 222 using control voltage element(s) 202. D2 may comprise an additional diode that is used in the circuit in order for the protection elements to leverage bootstrap capacitor 222. D2 may comprise a passive diode or an active diode (e.g., a controllable transistor with a body diode). An active diode may require less circuit space than a passive diode, and therefore, in some cases, an active diode may provide advantages over a passive diode. Resistor 206 may be included to limit current delivered to kill switch 210.

In addition to monitoring tristate, additional protection elements are also illustrated in FIG. 2 for performing additional monitoring that is independent of whether DC/DC power converter 220 is operating in CCM or non-CCM. In some examples, protection circuit elements may include VDS comparator 212, which may monitor voltage drop over protection transistor Q3 is greater than a voltage threshold. If so, VDS comparator 212 may send a signal to logic 208 that may ultimately cause kill switch 210 and protection transistor Q3 to disable a supply to DC/DC power converter 220. Again, to disable the supply, logic 208 may send a signal to kill switch 210 to turn on kill switch 210. Turning on kill switch 210, in turn, may cause protection transistor Q3 to turn off, which disconnects the supply voltage (VBat) from DC/DC power converter 220.

In some examples, protection circuit elements may also include current sensing unit 214, which may be used in addition to or instead of VDS comparator 212. Current sensing unit 214 may be configured to sense current on the node between protection transistor Q3 and high side switch Q2, which may be indicative of the current through protection transistor Q3. In this case, logic 208 may be configured to protect DC/DC power converter 220 when current through protection transistor Q3 is greater than a current threshold. As with other non-CCM monitoring and CCM monitoring described herein, in order to disable the supply based on the current sensing of current sensing unit 214, logic 208 may send a signal to kill switch 210 to turn on kill switch 210. Turning on kill switch 210, in turn, may cause protection transistor Q3 to turn off, which disconnects the supply voltage (VBat) from DC/DC power converter 220. Again, according to this disclosure, any of the monitoring and disabling of the supply to DC/DC power converter 220 may be based on comparisons that occur in less than 100 microseconds, which is typically sufficient timing to protect DC/DC power converter 220 from short circuit events that could otherwise deliver too much charge to the inductor and ultimately to the load.

Figure 3:
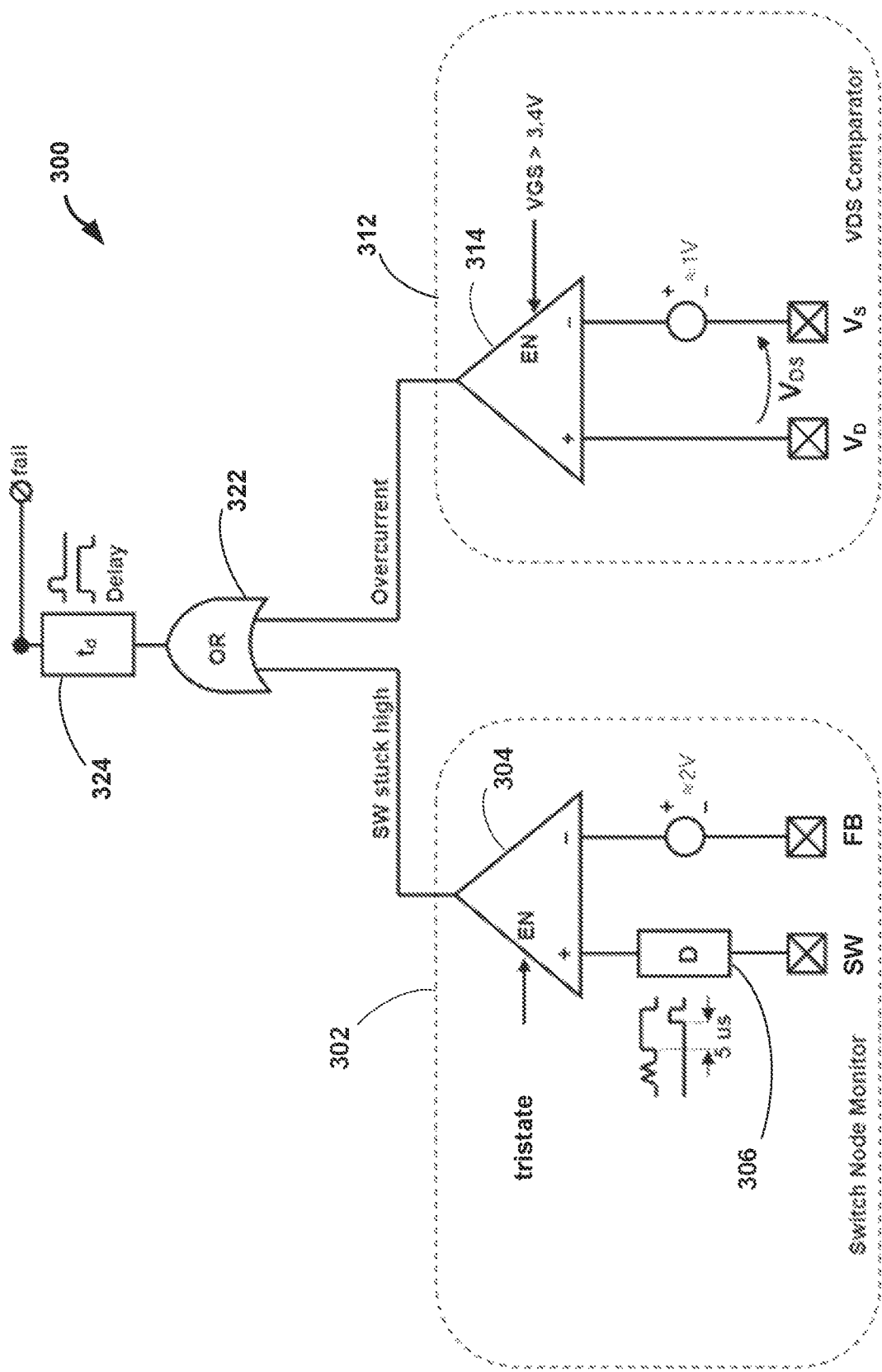
FIG. 3 is a circuit diagram showing some example logic that may be used to implement aspects of a protection circuit.

FIG. 3 is a circuit diagram showing some example logic that may be used to implement aspects of a protection circuit. Logic 300, for example, may correspond to various portions of logic 208, comparator 216, and comparator 212 shown in FIG. 2. Logic 300 may be used to combine switch node monitoring with voltage monitoring across the protection transistor. If additional current monitoring is also used (such as via current sensing unit 214 of FIG. 2), then an additional OR gate may be implemented in logic 300 to account for the current monitoring.

In the example logic 300 shown in FIG. 3, a switch node monitor 302 is used to determine if the switch node is stuck high, and a VDS comparator 312 is used to determine if the voltage across the protection transistor exceeds a voltage threshold. Comparator 314 may be similar to comparator 212 of FIG. 2 and may be enabled by the gate voltage applied to the protection transistor. In particular, comparator 314 may be enabled when the protection transistor is on, which in the case of an NMOS, may require a gate to source voltage above 3.4 Volts (or some other VGS threshold). If comparator 314 determines that that voltage over the protection circuit is above a threshold, this may indicate an overcurrent condition. Upon detecting an overcurrent condition, a brief delay can be added to the signal by delay unit 324 to prolong the signal. Protection circuit elements may respond to the overcurrent condition so as to cause the protection transistor (e.g., Q3 of FIG. 2) to turn off.

Comparator 304 may be similar to comparator 216 of FIG. 2. Comparator 304 may be enabled when tristate condition is detected. In this case, upon detecting a tristate condition, after deglitching (e.g., approximately 5 microseconds to define a clean and stable signal) by deglitch unit 306, comparator 304 may compare the voltage on the switch node (e.g., between Q2 and Q1 of FIG. 2) to the feedback node voltage (FB in FIG. 2). Upon determining that the power converter is operating in tristate, comparator 304 may be configured to determine whether the switch node voltage exceeds the feedback node voltage by more than a threshold. If so, comparator 304 may output a signal indicating that the switch node is stuck high. Thus, upon detecting that the switch node is stuck high, after a brief delay by delay unit 324 is added to the signal to prolong the signal, the protection circuit elements may respond to the stuck high condition so as to cause the protection transistor (e.g., Q3 of FIG. 2) to turn off. OR gate 322 may correspond to a portion of logic 208 of FIG. 2. OR gate 322 may be used so that logic 300 can respond to either overcurrent conditions (regardless of CCM or tristate) and to switch node conditions (when in tristate). Current sensor monitoring could replace VDS monitoring in some examples. Also, current sensor monitoring could be used with VDS monitoring in some examples, in which case logic 300 may include an additional OR gate so that the protection elements can respond to switch node problems, problems detected by VDS monitoring, or problems detected by current sensing.

Figure 4:
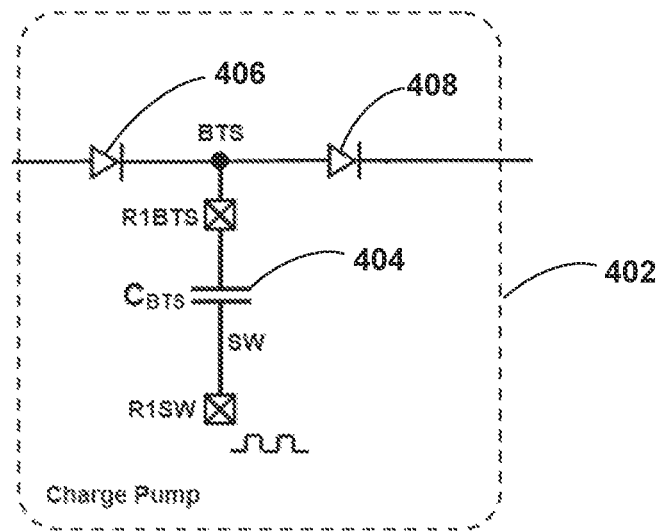
FIG. 4 is a circuit diagram showing an example charge pump that may be used to control a protection switch using the bootstrap capacitor of a DC/DC power converter.

FIG. 4 is a circuit diagram showing an example charge pump circuit 402 that may be used to control a protection switch using the bootstrap capacitor 404 of a DC/DC power converter. Charge pump 402 may provide voltage needed to a control protection transistor (e.g., Q3 of FIG. 2), which may require a substantial gate to source voltage, e.g., in the case of an NMOS transistor being used for the protection. In the example of FIG. 4, charge pump circuit 402 exploits the existing bootstrap capacitor ("CBTS") 404, which may also be used by a DC/DC power converter for controlling a high side switch (e.g., Q2 of FIG. 2). Accordingly, in addition to being connected as part of a DC/DC power converter, bootstrap capacitor 404 also forms part of charge pump 402 so that the charge on bootstrap capacitor 404 can be leveraged to control a protection transistor (e.g., Q3 of FIG. 2).

In FIG. 4, charge pump circuit 402 comprises passive diodes 406 and 408, with the bootstrap capacitor voltage provided to the node between passive diodes 406 and 408. Diode 406 may comprise an existing diode that is part of a charging circuit for charging of bootstrap capacitor 404 for its use in controlling the high side switch of the DC/DC power converter. Diode 408 may comprise an additional diode that allows the protection elements to leverage bootstrap capacitor 404.

Figure 5:
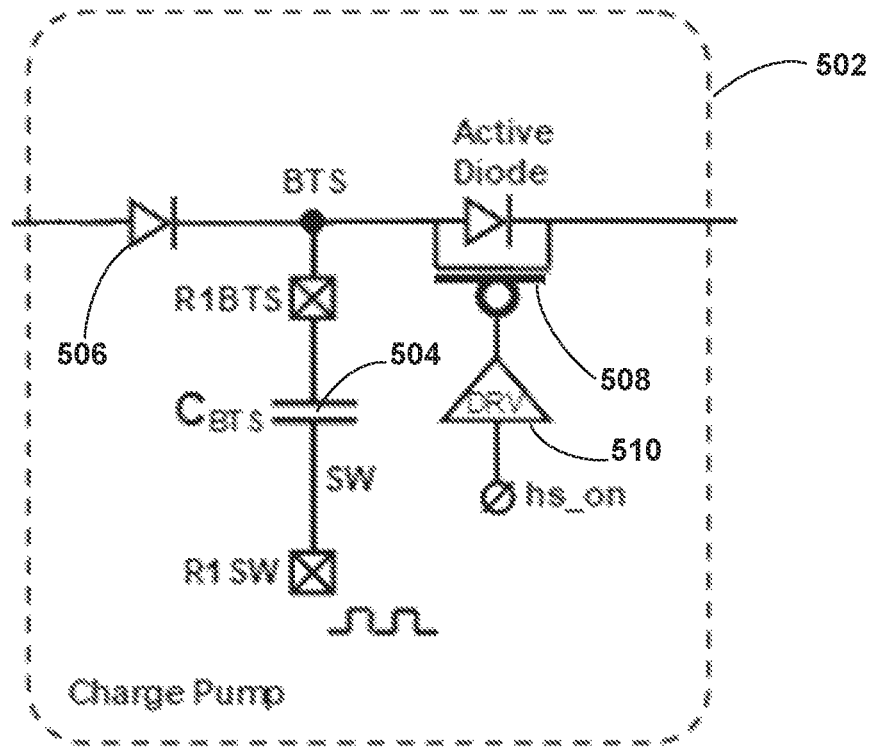
FIG. 5 is circuit diagram showing another example of charge pump that uses an active diode.

FIG. 5 is circuit diagram showing another example of charge pump that uses an active diode 508, which may comprise a transistor formed with a body diode. A gate driver circuit 510 may control the active diode 508 by controlling whether the transistor is conducting or non-conducting. When non-conducting, active diode 508 operates similarly to a passive diode, e.g., to block current in one direction. Similar to FIG. 4, diode 506 of FIG. 5 may comprise an existing diode that is part of a charging circuit associated with the charging of bootstrap capacitor 504 for its use in controlling the high side switch of a DC/DC power converter. Active diode 508, in contrast, may comprise an additional diode needed in order for the protection elements to leverage bootstrap capacitor 504.

A passive diode 408 (shown in FIG. 4) may be less complex than an active diode 508 (shown in FIG. 5) and may be desirable for this reason. On the other hand, a passive diode 408 may require more circuit space than an active diode 508, and therefore, in some cases, an active diode 508 may provide size and space saving advantages over a passive diode 408.

Figure 6:
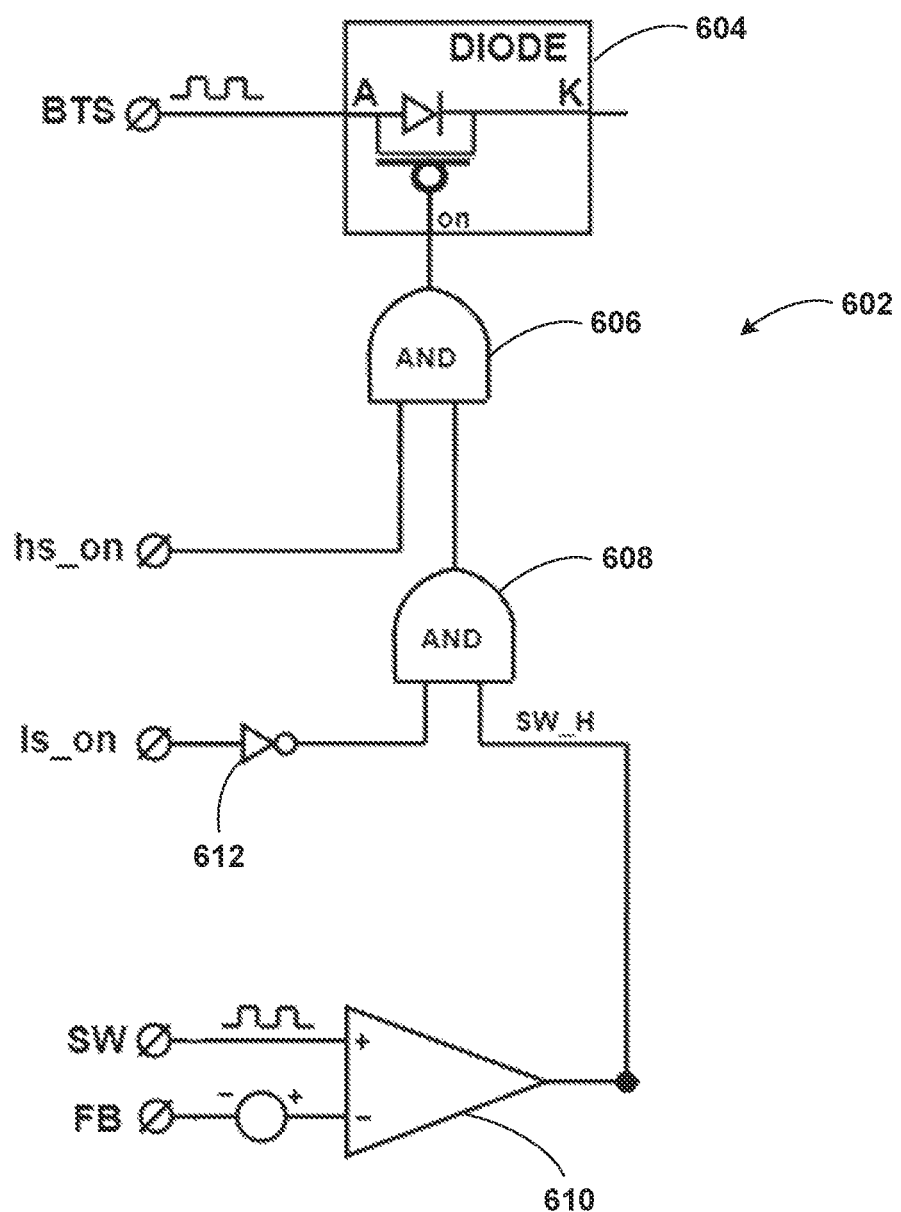
FIG. 6 is a circuit diagram showing some example logic that may be used to implement aspects of a protection circuit.

FIG. 6 is a circuit diagram showing some example logic that may be used to implement aspects of a protection circuit that includes a charge pump with an active diode like that shown in FIG. 5. In this case, active diode 604 may comprise a transistor formed with a body diode. In order to control active diode 604 consistent with the techniques of this disclosure, the ON state of the transistor may be controlled based on logic. The logic in the example of FIG. 6 includes AND gate 606, AND gate 608, and comparator 610. Comparator 610, for example, may comprise a comparator that positioned is in parallel with comparator 216 of FIG. 2, and the two comparators may receive similar inputs SW and FB.

Comparator 610 may compare a switch node voltage (SW) on the switch node of the DC/DC power converter to a feedback node voltage (FB) on an output node of the DC/DC power converter. If the switch node voltage exceeds to the feedback node voltage by more than a defined threshold, comparator 610 may send a signal (logic=SW_H=1) to the right input of AND gate 608. If low side switch is in an OFF state, then inverter 612 causes a logic signal (logic=1) to be sent to the left input of AND gate 608. Accordingly, in response to determining that the low side switch is in an OFF state and the switch node is in an elevated voltage condition relative to the output of the DC/DC converter, AND gate 608 may output a signal (logic=1) to the right side input of AND gate 606. In addition, if the high side switch of the DC/DC converter is ON, the left side input of AND gate 606 may receive a signal (logic=1) causing AND gate 606 to output an ON signal to the transistor of active diode 604. In summary, according to logic 602, active diode 604 is turned ON when the high side switch is ON, the low side switch is OFF, and the switch node is an elevated voltage condition relative to the output of the DC/DC converter, and otherwise, active diode 604 is turned OFF to operate as a passive diode.

Figure 7:
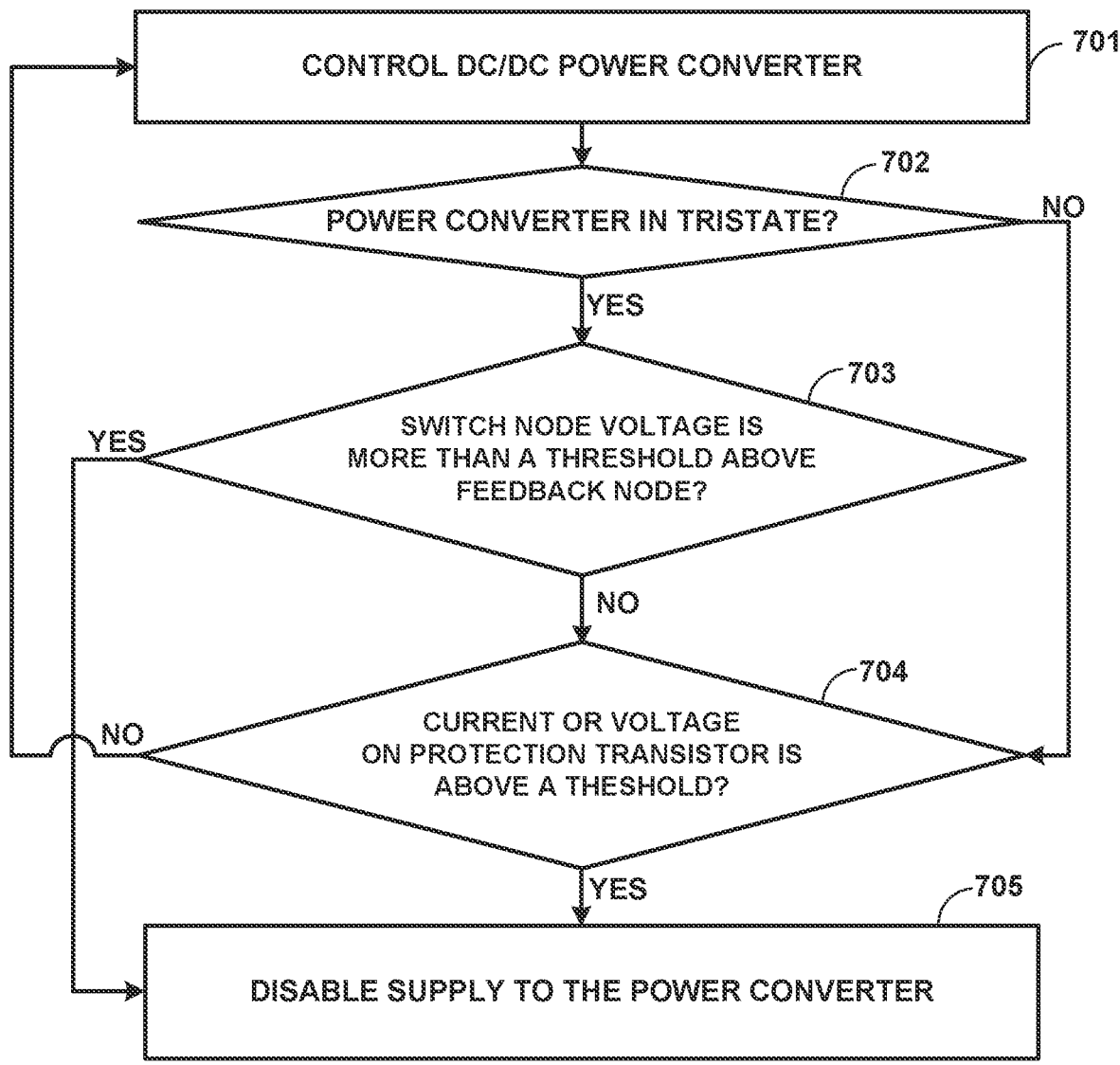
FIG. 7 is an example flow diagram consistent with this disclosure.

FIG. 7 is an example flow diagram consistent with this disclosure. FIG. 7 will be described from the perspective of device 200 of FIG. 2, although some or all of the method may be performed by one or more circuits within device 200 or by another circuit. As shown in FIG. 7, half-bridge controller 218 controls DC/DC power converter 220 (701), e.g., by controlling PWM signals to the gates of high side switch Q2 and low side switch Q1.

Tristate unit 215 may determine when DC/DC power converter 220 is operating in a tristate mode (702). For example, tristate unit 215 may determine tristate mode by identifying that Q1 and Q2 are both turned OFF over one or more switching cycles. If tristate unit 215 determines that DC/DC power converter 220 is operating in tristate (yes branch of 702), then comparator 216 compares a switch node voltage on the switch node of DC/DC power converter 220 to a feedback node voltage (FB) on an output node of DC/DC power converter 220 (703). The switch node may correspond to the node between high side switch Q2 and low side switch Q1. If the switch node voltage is more than a threshold above the feedback node voltage (yes branch of 703), then device 200 may disable the supply to DC/DC power converter 220 (705). In particular, if the switch node voltage is more than a threshold above the feedback node voltage (yes branch of 703), then comparator 216 may send a signal to logic 208 that may ultimately cause kill switch 210 and protection transistor Q3 to disable a supply to DC/DC power converter 220. Even more specifically, to disable the supply (705), logic 208 may send a signal to kill switch 210 to turn on kill switch 210. Turning on kill switch 210, in turn, may cause protection transistor Q3 to turn off, which disconnects the supply voltage (VBat) from DC/DC power converter 220.

In addition to monitoring tristate (702), the method shown in FIG. 7 may also perform additional monitoring that is independent of whether DC/DC power converter 220 is operating in CCM or non-CCM. One or more additional protection elements (such as VDS comparator 212 and/or current sensing unit 214) may determine if current through and/or voltage over protection transistor Q3 is above a threshold (704). If so, then device 200 may disable the supply to DC/DC power converter 220 (705). In particular, if current through protection transistor Q3 and/or voltage over protection transistor Q3 is above a threshold (704), then comparator 212 or current sensing unit 214 may send a signal to logic 208 that may ultimately cause kill switch 210 and protection transistor Q3 to disable a supply to DC/DC power converter 220. As noted, to disable the supply (705), logic 208 may send a signal to kill switch 210 to turn on kill switch 210. Turning on kill switch 210, in turn, may cause protection transistor Q3 to turn off, which disconnects the supply voltage (VBat) from DC/DC power converter 220.

Consistent with the example of FIG. 7, in some cases, a method may comprise determining when a power converter is operating in a tristate mode (702), and upon determining that the power converter is operating in tristate (yes branch of 702), disabling a supply to the power converter (705) based on a comparison of a switch node voltage on the switch node to a feedback node voltage on the output node. As described herein, the power converter may comprise a high side switch, a low side switch, and a control circuit configured to control ON/OFF switching of the high side switch and the low side switch, wherein the power converter further includes an inductor and an output capacitor, wherein the inductor is connected to a switch node between the high side switch and the low side switch, and wherein the output capacitor is connected to the inductor at an output node of the power converter.

In addition, consistent with step 704 shown in FIG. 7, a method may include disabling the supply to the power converter in response to a voltage drop over the protection transistor being greater than a voltage threshold, or disabling the supply to the power converter in response to current through the protection transistor being greater than a current threshold.

As explained in greater detail above, controlling the high side switch Q2 may be based on a charge provided by a bootstrap capacitor 222. The method of FIG. 7 may leverage bootstrap capacitor 222 in disabling a supply to the power converter (705). In particular, the method may include controlling a protection transistor Q3 based on the charge provided by the bootstrap capacitor 222, wherein the protection transistor Q3 is configured to turn off to disable the supply. Also, a process of disabling the supply to the power converter (705) may also include controlling a charge pump to provide charge for controlling the protection transistor, wherein the bootstrap capacitor 222 is part of the charge pump. As shown in FIG. 4, the charge pump may comprise a diode 408 between the bootstrap capacitor 404 and a gate of the protection transistor. Alternatively, as shown in FIG. 5, the charge pump may comprise a further transistor operating as an active diode 508, wherein the further transistor operating as active diode 508 positioned between the bootstrap capacitor 504 and a gate of the protection transistor.

The following clauses may illustrate one or more aspects of the disclosure.

Clause 1—A protection circuit configured to protect a power converter, wherein the protection circuit is configured to: determine when the power converter is operating in a tristate mode, and upon determining that the power converter is operating in the tristate mode, disable a supply to the power converter based on a comparison of a switch node voltage on a switch node of the power converter to a feedback node voltage on an output node of the power converter.

Clause 2—The protection circuit of clause 1, wherein the protection circuit comprises a protection transistor configured to turn off to disable the supply.

Clause 3—The protection circuit of clause 2, wherein the protection circuit comprises a kill switch configured to turn on to disable the supply, wherein the protection transistor is configured to turn off when the kill switch turns on.

Clause 4—The protection circuit of clause 2 or 3, wherein the protection circuit is further configured to disable the supply to the power converter in response to a voltage drop over the protection transistor being greater than a voltage threshold.

Clause 5—The protection circuit of any of clauses 2-4, wherein the protection circuit is further configured to disable the supply to the power converter in response to current through the protection transistor being greater than a current threshold.

Clause 6—The protection circuit of any of clauses 2-5, wherein the power converter includes a bootstrap capacitor configured to provide charge for controlling a high side switch of the power converter, and wherein the protection transistor receives charge from the bootstrap capacitor for controlling the protection transistor.

Clause 7—The protection circuit of clause 6, further comprising a charge pump configured to provide charge for controlling the protection transistor, wherein the bootstrap capacitor is part of the charge pump.

Clause 8—The protection circuit of clause 7, wherein the charge pump comprises a diode between the bootstrap capacitor and a gate of the protection transistor.

Clause 9—The protection circuit of clause 7, wherein the charge pump comprises a further transistor operating as an active diode, wherein the further transistor is positioned between the bootstrap capacitor and a gate of the protection transistor.

Clause 10—The protection circuit of any of clauses 1-9, wherein the protection circuit is configured to determine that the power converter is operating in the tristate mode and to disable supply to the power converter based on the comparison in less than 100 microseconds.

Clause 11—The protection circuit of any of clauses 1-10, wherein upon determining that the power converter is operating in the tristate mode the protection circuit is configured to disable the supply to the power converter in response to the switch node voltage exceeding the feedback node voltage by more than a threshold.

Clause 12—The protection circuit of any of clauses 1-11, wherein the tristate mode refers a state of operation where both the high side switch and the low side switch both are turned OFF for one or more switching cycles.

Clause 13—A method comprising: determining when a power converter is operating in a tristate mode, wherein the power converter comprises a high side switch, a low side switch, and a control circuit configured to control ON/OFF switching of the high side switch and the low side switch, wherein the power converter further includes an inductor and an output capacitor, wherein the inductor is connected to a switch node between the high side switch and the low side switch, and wherein the output capacitor is connected to the inductor at an output node of the power converter; and upon determining that the power converter is operating in the tristate mode, disabling a supply to the power converter based on a comparison of a switch node voltage on the switch node to a feedback node voltage on the output node.

Clause 14—The method of clause 13, further comprising: disabling the supply to the power converter in response to a voltage drop over the protection transistor being greater than a voltage threshold.

Clause 15—The method of clause 13 or 14, further comprising: disabling the supply to the power converter in response to current through the protection transistor being greater than a current threshold.

Clause 16—The method of any of clauses 13-15, further comprising: controlling the high side switch based on a charge provided by a bootstrap capacitor; and controlling a protection transistor based on the charge provided by the bootstrap capacitor, wherein the protection transistor is configured to turn off to disable the supply.

Clause 17—The method of clause 16, further comprising controlling a charge pump to provide charge for controlling the protection transistor, wherein the bootstrap capacitor is part of the charge pump.

Clause 18—The method of clause 17, wherein the charge pump comprises a diode between the bootstrap capacitor and a gate of the protection transistor.

Clause 19—The method of clause 17, wherein the charge pump comprises a further transistor operating as an active diode, wherein the further transistor positioned between the bootstrap capacitor and a gate of the protection transistor.

Clause 20—A device comprising: a power converter comprising a high side switch, a low side switch, and a controller circuit configured to control ON/OFF switching of the high side switch and the low side switch, wherein the power converter further includes an inductor and an output capacitor, wherein the inductor is connected to a switch node between the high side switch and the low side switch and the output capacitor is connected to the inductor at an output node of the power converter; and a protection circuit configured to: determine when the power converter is operating in a tristate mode, and upon determining that the power converter is operating in the tristate mode, disable a supply to the power converter based on a comparison of a switch node voltage on the switch node to a feedback node voltage on the output node.

Various aspects have been described in this disclosure. These and other aspects are within the scope of the following claims.

The invention claimed is:

1. A protection circuit configured to protect a power converter, wherein the protection circuit is configured to:
   determine when the power converter is operating in a tristate mode, and
   upon determining that the power converter is operating in the tristate mode, disable a supply to the power converter based on a comparison of a switch node voltage on a switch node of the power converter to a feedback node voltage on an output node of the power converter.

2. The protection circuit of claim 1, wherein the protection circuit comprises a protection transistor configured to turn off to disable the supply.

3. The protection circuit of claim 2, wherein the protection circuit comprises a kill switch configured to turn on to disable the supply, wherein the protection transistor is configured to turn off when the kill switch turns on.

4. The protection circuit of claim 2, wherein the protection circuit is further configured to disable the supply to the power converter in response to a voltage drop over the protection transistor being greater than a voltage threshold.

5. The protection circuit of claim 2, wherein the protection circuit is further configured to disable the supply to the power converter in response to current through the protection transistor being greater than a current threshold.

6. The protection circuit of claim 2, wherein the power converter includes a bootstrap capacitor configured to provide charge for controlling a high side switch of the power converter, and wherein the protection transistor receives charge from the bootstrap capacitor for controlling the protection transistor.

7. The protection circuit of claim 6, further comprising a charge pump configured to provide charge for controlling the protection transistor, wherein the bootstrap capacitor is part of the charge pump.

8. The protection circuit of claim 7, wherein the charge pump comprises a diode between the bootstrap capacitor and a gate of the protection transistor.

9. The protection circuit of claim 7, wherein the charge pump comprises a further transistor operating as an active diode, wherein the further transistor is positioned between the bootstrap capacitor and a gate of the protection transistor.

10. The protection circuit of claim 1, wherein the protection circuit is configured to determine that the power converter is operating in the tristate mode and to disable the supply to the power converter based on the comparison in less than 100 microseconds.

11. The protection circuit of claim 1, wherein upon determining that the power converter is operating in the tristate mode the protection circuit is configured to disable the supply to the power converter in response to the switch node voltage exceeding the feedback node voltage by more than a threshold.

12. The protection circuit of claim 1, wherein the tristate mode refers a state of operation where both a high side switch and a low side switch of the power converter are turned OFF for one or more switching cycles.

13. A method comprising:
determining when a power converter is operating in a tristate mode, wherein the power converter comprises a high side switch, a low side switch, and a control circuit configured to control ON/OFF switching of the high side switch and the low side switch, wherein the power converter further includes an inductor and an output capacitor, wherein the inductor is connected to a switch node between the high side switch and the low side switch, and wherein the output capacitor is connected to the inductor at an output node of the power converter; and upon determining that the power converter is operating in the tristate mode, disabling a supply to the power converter based on a comparison of a switch node voltage on the switch node to a feedback node voltage on the output node.

14. The method of claim 13, further comprising:
disabling the supply to the power converter in response to a voltage drop over a protection transistor being greater than a voltage threshold.

15. The method of claim 13, further comprising:
disabling the supply to the power converter in response to current through a protection transistor being greater than a current threshold.

16. The method of claim 13, further comprising:
controlling the high side switch based on a charge provided by a bootstrap capacitor; and
controlling a protection transistor based on the charge provided by the bootstrap capacitor, wherein the protection transistor is configured to turn off to disable the supply.

17. The method of claim 16, further comprising controlling a charge pump to provide charge for controlling the protection transistor, wherein the bootstrap capacitor is part of the charge pump.

18. The method of claim 17, wherein the charge pump comprises a diode between the bootstrap capacitor and a gate of the protection transistor.

19. The method of claim 17, wherein the charge pump comprises a further transistor operating as an active diode, wherein the further transistor positioned between the bootstrap capacitor and a gate of the protection transistor.

20. A device comprising:
a power converter comprising a high side switch, a low side switch, and a controller circuit configured to control ON/OFF switching of the high side switch and the low side switch, wherein the power converter further includes an inductor and an output capacitor, wherein the inductor is connected to a switch node between the high side switch and the low side switch and the output capacitor is connected to the inductor at an output node of the power converter; and
a protection circuit configured to:
determine when the power converter is operating in a tristate mode, and upon determining that the power converter is operating in the tristate mode, disable a supply to the power converter based on a comparison of a switch node voltage on the switch node to a feedback node voltage on the output node.

* * * * *